(12) United States Patent
Noda

(10) Patent No.: US 9,699,920 B2
(45) Date of Patent: Jul. 4, 2017

(54) PRINTED WIRING BOARD

(71) Applicant: IBIDEN CO., LTD., Ogaki-shi (JP)

(72) Inventor: Kota Noda, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 199 days.

(21) Appl. No.: 14/609,596

(22) Filed: Jan. 30, 2015

(65) Prior Publication Data

US 2015/0223338 A1  Aug. 6, 2015

(30) Foreign Application Priority Data

Feb. 3, 2014 (JP) ................................. 2014-018613

(51) Int. Cl.
*H05K 7/10* (2006.01)
*H05K 7/12* (2006.01)
*H05K 3/40* (2006.01)
*H01L 23/538* (2006.01)
*H01L 25/10* (2006.01)

(52) U.S. Cl.
CPC ....... *H05K 3/4015* (2013.01); *H01L 23/5383* (2013.01); *H01L 23/5384* (2013.01); *H01L 23/5389* (2013.01); *H01L 25/105* (2013.01); *H01L 2224/131* (2013.01); *H01L 2224/16227* (2013.01); *H01L 2225/1023* (2013.01); *H01L 2225/1058* (2013.01); *H01L 2924/1533* (2013.01); *H01L 2924/15311* (2013.01); *H01L 2924/15331* (2013.01); *H01L 2924/18161* (2013.01); *H05K 2201/0367* (2013.01); *H05K 2201/042* (2013.01); *H05K 2201/10674* (2013.01); *H05K 2203/0338* (2013.01); *Y10T 29/49147* (2015.01)

(58) Field of Classification Search
USPC .......................... 361/771, 767; 174/267, 258
See application file for complete search history.

(56) References Cited

U.S. PATENT DOCUMENTS

| 7,723,834 B2 | 5/2010 | Hwang | |
| 2009/0032943 A1* | 2/2009 | Shoji | H01L 21/4832 257/737 |
| 2009/0174081 A1* | 7/2009 | Furuta | H01L 23/49838 257/777 |

* cited by examiner

*Primary Examiner* — Andargie M Aychillhum
(74) *Attorney, Agent, or Firm* — Oblon, McClelland, Maier & Neustadt, L.L.P.

(57) ABSTRACT

A printed wiring board includes a first substrate having first pads and second pads such that the first pads are positioned to mount an electronic component on the first substrate and that the second pads are positioned to electrically connect a second substrate to the first substrate, and metal posts formed on the second pads, respectively, such that the metal posts are positioned to mount the second substrate on the first substrate. The first substrate and the metal posts satisfy that a ratio, b/e, is in a range from 0.3 to 1.0, where b represents a length of each of the metal posts and e represents a thickness of the first substrate.

20 Claims, 14 Drawing Sheets

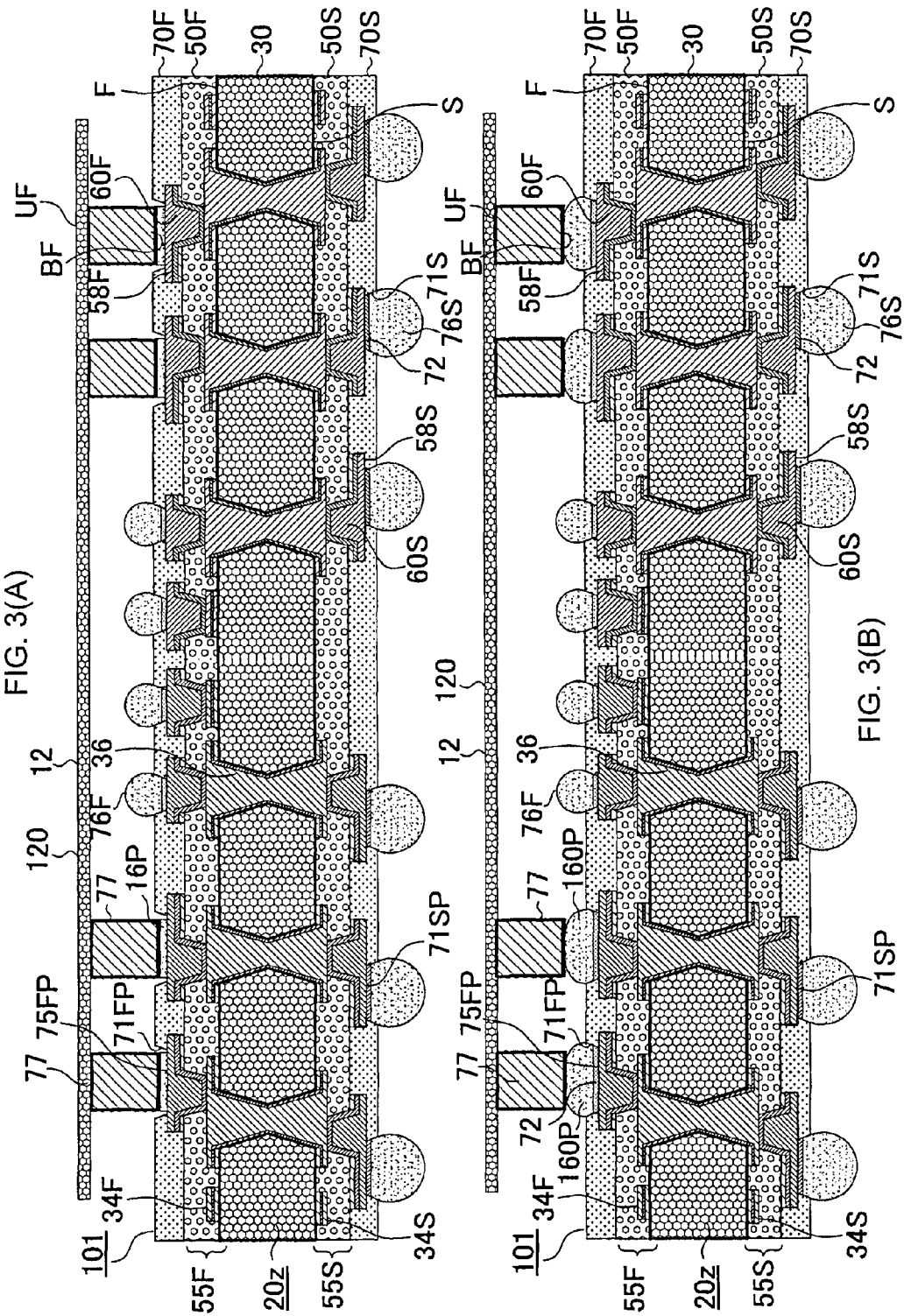

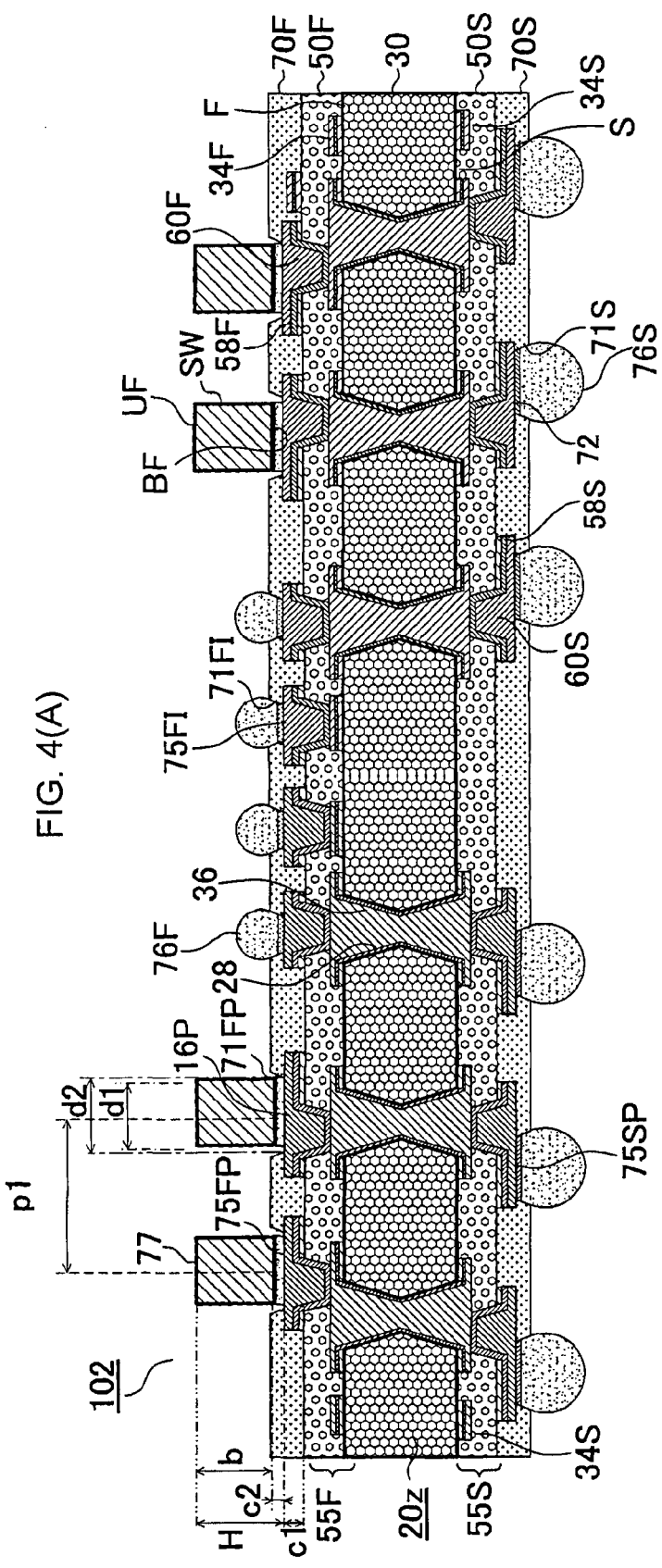
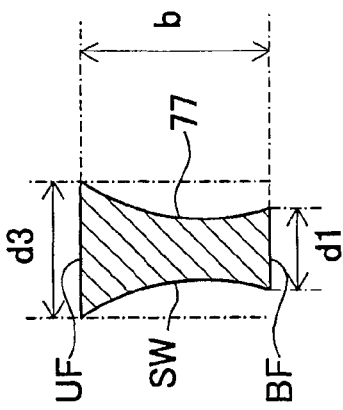
FIG. 4(A)
FIG. 4(B)

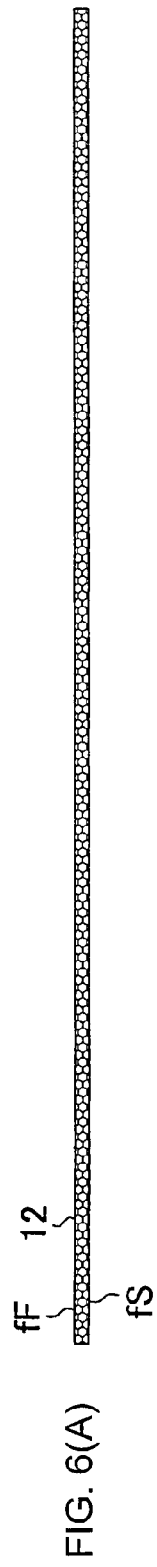
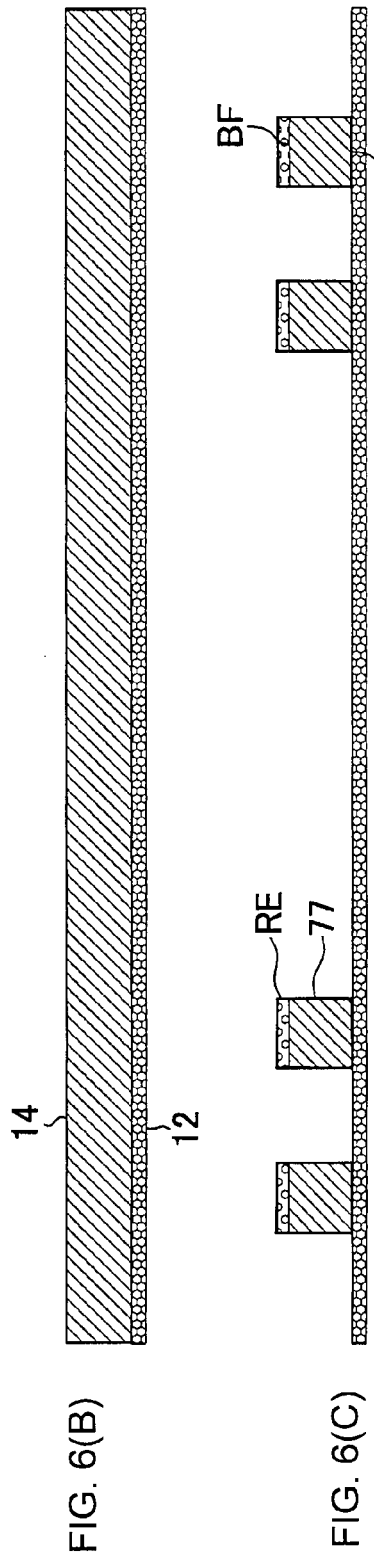
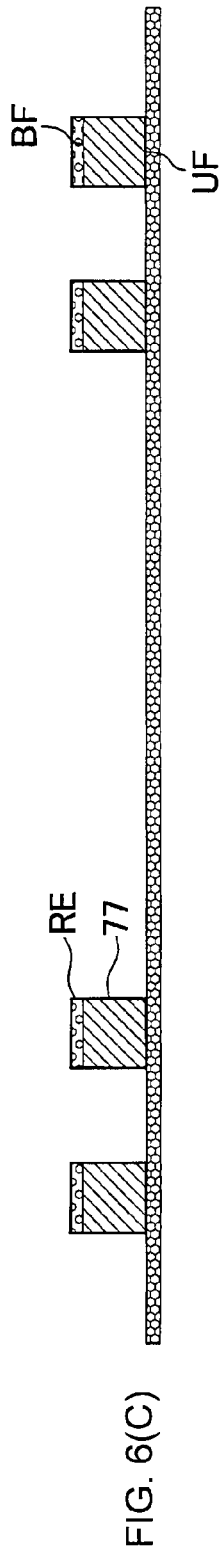
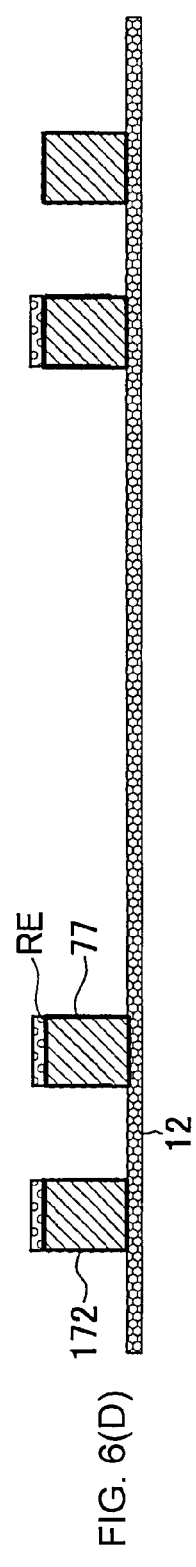
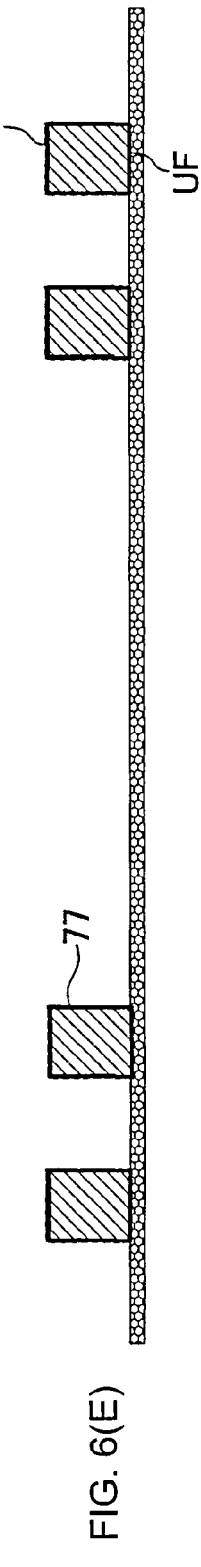

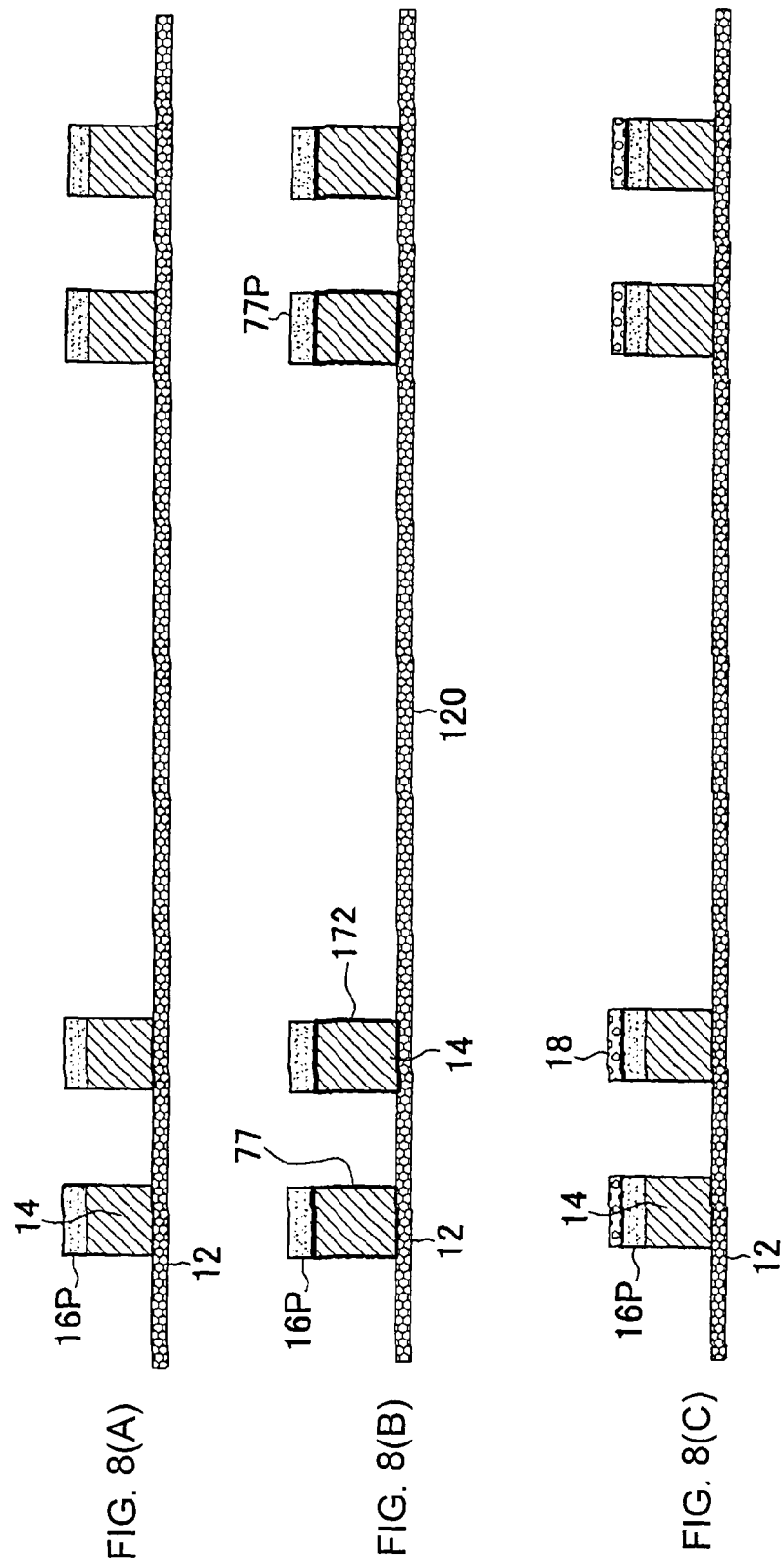

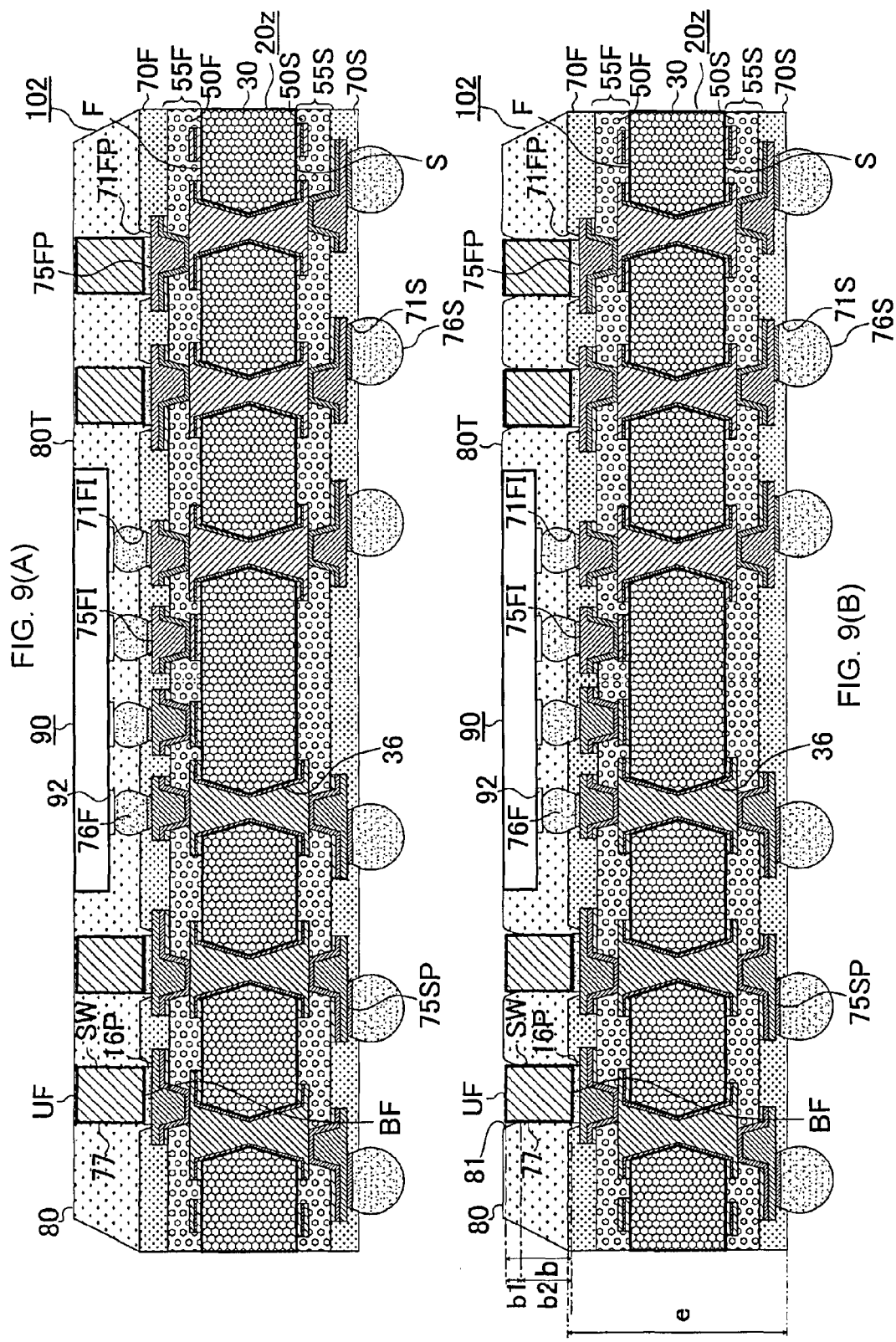

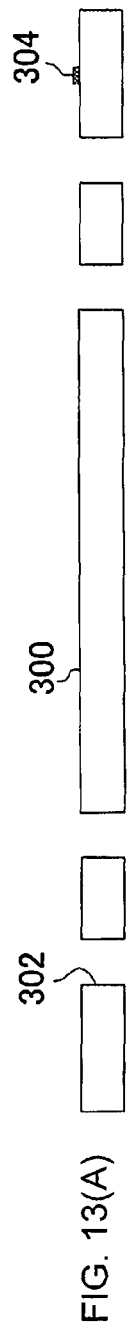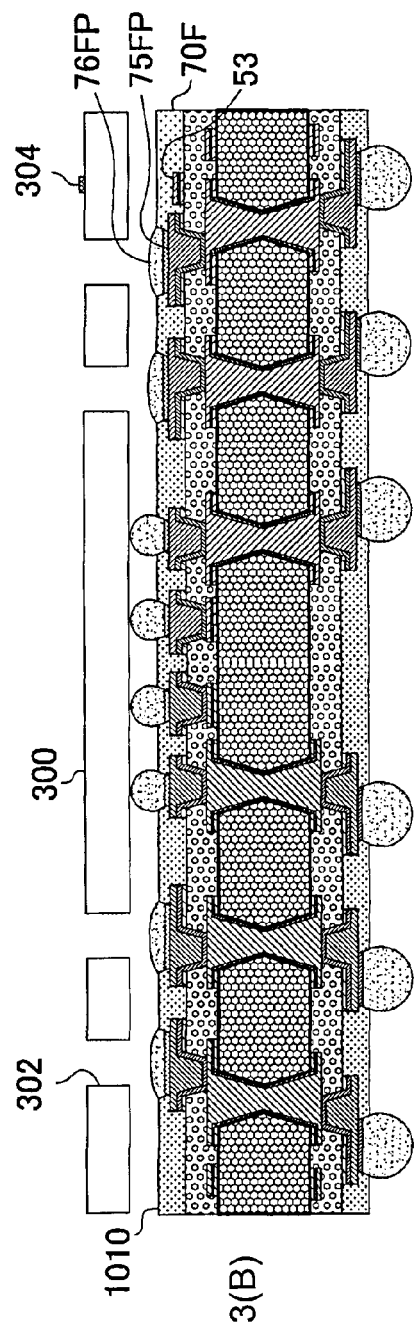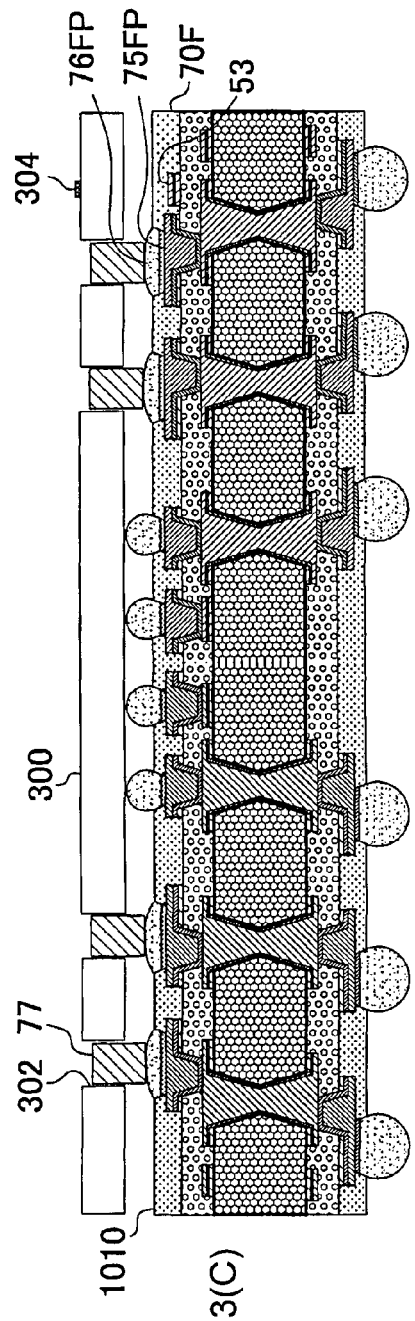
FIG. 13(A)
FIG. 13(B)
FIG. 13(C)

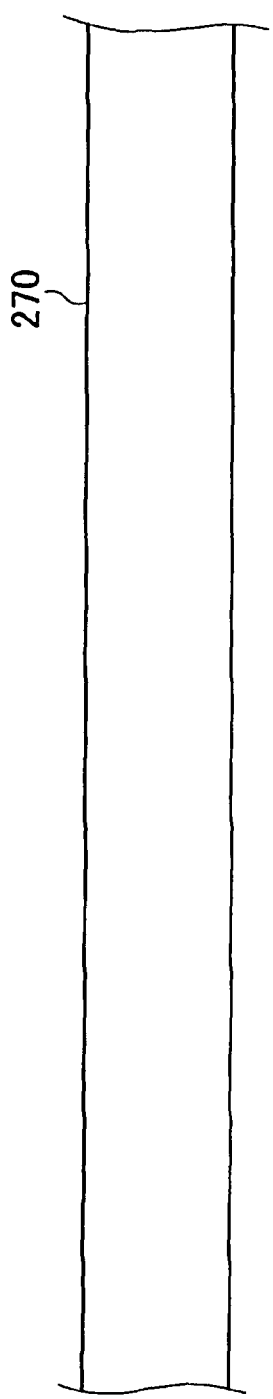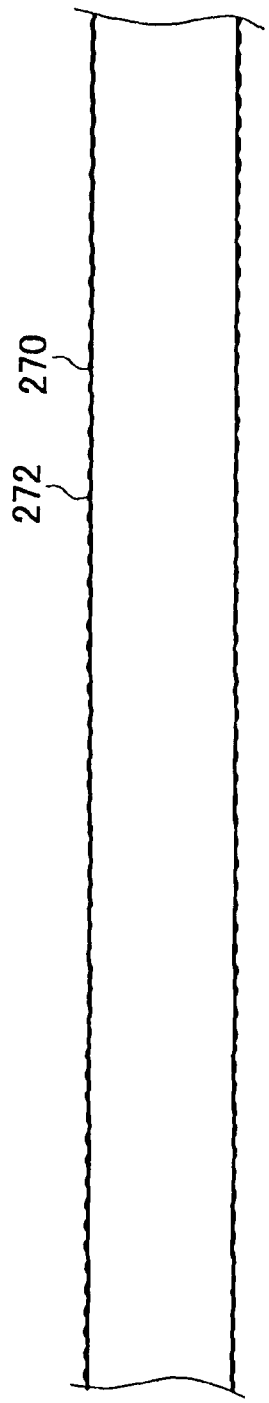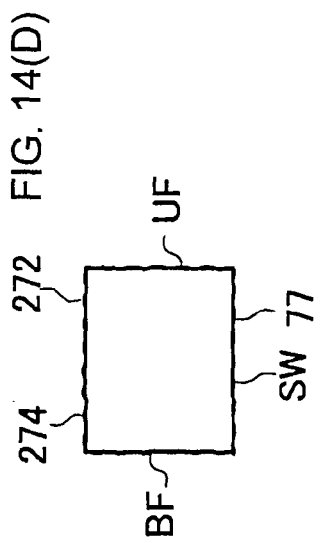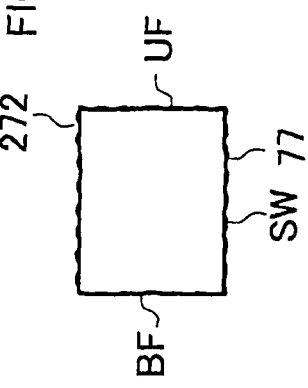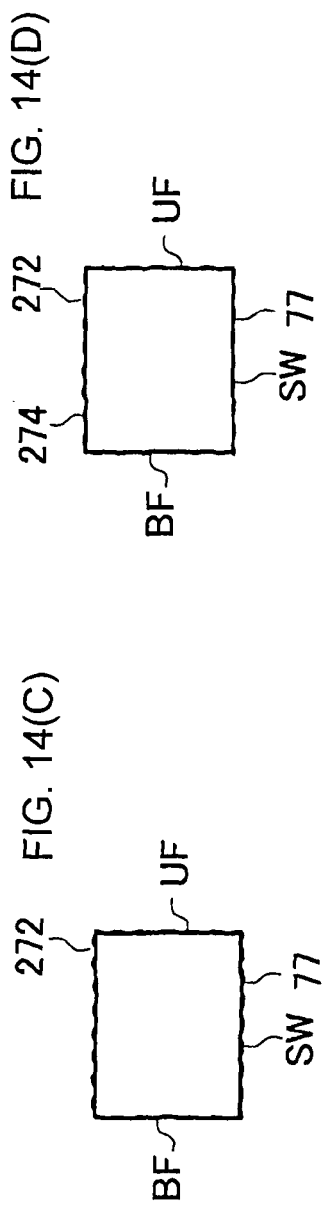

PRINTED WIRING BOARD

CROSS-REFERENCE TO RELATED APPLICATIONS

The present application is based upon and claims the benefit of priority to Japanese Patent Application No. 2014-018613, filed Feb. 3, 2014, the entire contents of which are incorporated herein by reference.

BACKGROUND OF THE INVENTION

Field of the Invention

The present invention relates to a printed wiring board having a metal post for mounting a second substrate.

Description of Background Art

U.S. Pat. No. 7,723,834 B2 describes a POP package and a manufacturing method thereof. According to U.S. Pat. No. 7,723,834 B2, a first semiconductor package and a second semiconductor package are connected by lead lines. The entire contents of this publication are incorporated herein by reference.

SUMMARY OF THE INVENTION

According to one aspect of the present invention, a printed wiring board includes a first substrate having first pads and second pads such that the first pads are positioned to mount an electronic component on the first substrate and that the second pads are positioned to electrically connect a second substrate to the first substrate, and metal posts formed on the second pads, respectively, such that the metal posts are positioned to mount the second substrate on the first substrate. The first substrate and the metal posts satisfy that a ratio, b/e, is in a range from 0.3 to 1.0, where b represents a length of each of the metal posts and e represents a thickness of the first substrate.

According to another aspect of the present invention, a method for manufacturing a printed wiring board includes forming first pads on a first substrate such that the first pads are positioned to mount an electronic component on the first substrate, forming second pads such that the second pads are positioned to electrically connect a second substrate to the first substrate, and forming metal posts on the second pads, respectively, such that the metal posts are positioned to mount the second substrate on the first substrate. The first substrate and the metal posts satisfy that a ratio, b/e, is in a range from 0.3 to 1.0, where b represents a length of each of the metal posts and e represents a thickness of the first substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 3A and 3B illustrate manufacturing process diagrams of the printed wiring board of the first embodiment;

FIG. 4A illustrates a cross-sectional view of the printed wiring board of the first embodiment;

FIG. 4B illustrates a first example of a metal post;

FIG. 6A-6E illustrate manufacturing process diagrams of a metal post of the printed wiring board according to the first embodiment;

FIG. 8A-8C illustrate manufacturing process diagrams of a metal post of the printed wiring board according to the first embodiment;

FIGS. 9A and 9B illustrate manufacturing process diagrams of an applied example of the printed wiring board according to the first embodiment;

FIG. 13A-13C illustrate manufacturing process diagrams of the printed wiring board of the second embodiment; and FIG. 14A-14D illustrate manufacturing process diagrams of a metal post of the second embodiment.

DETAILED DESCRIPTION OF THE EMBODIMENTS

Figure 1:
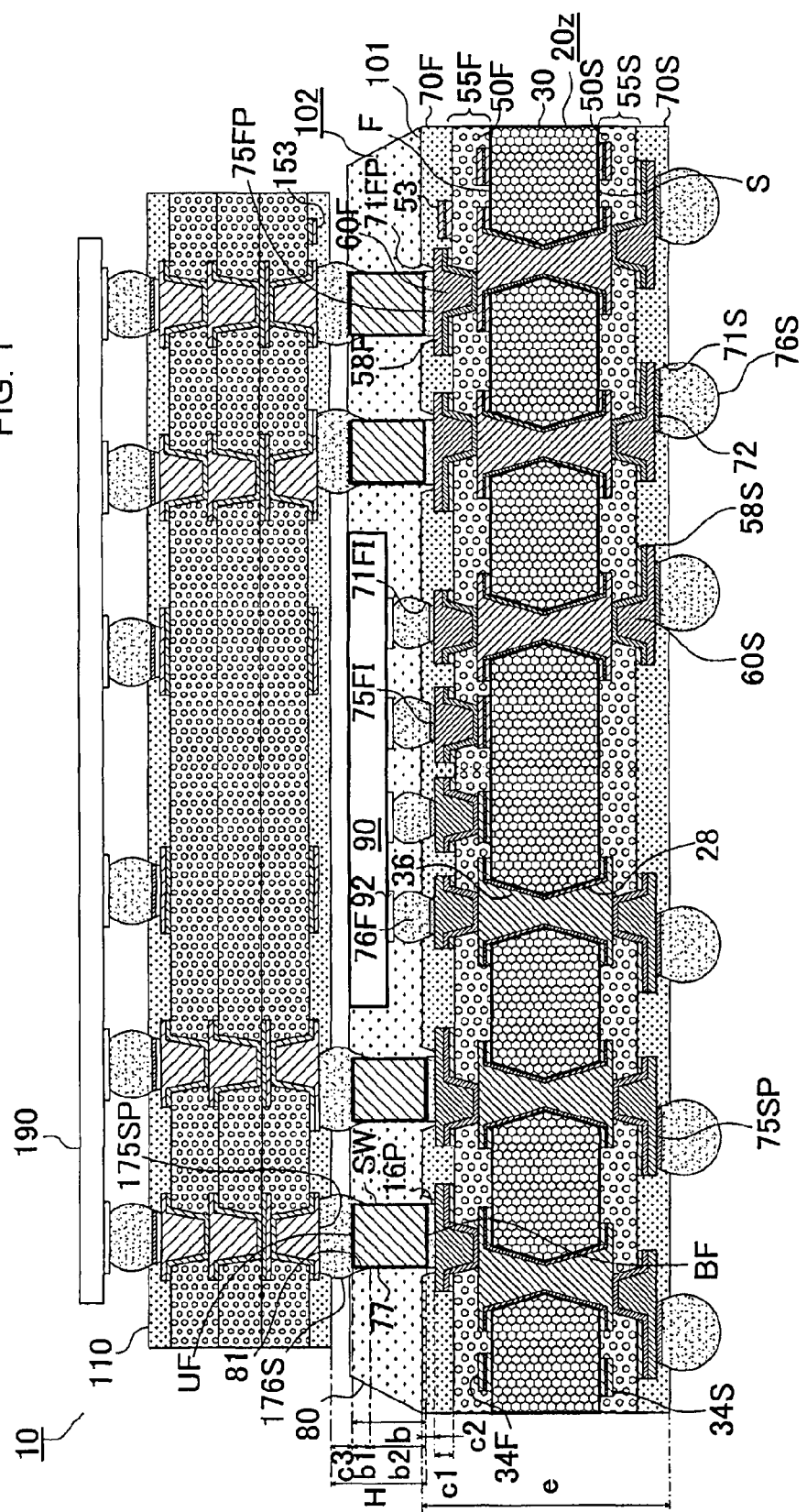
FIG. 1 illustrates a cross-sectional view of an applied example of a printed wiring board according to a first embodiment of the present invention.

The embodiments will now be described with reference to the accompanying drawings, wherein like reference numerals designate corresponding or identical elements throughout the various drawings.

First Embodiment

An applied example of a printed wiring board 102 (see FIG. 4A) according to a first embodiment of the present invention is illustrated in FIG. 1. The applied example is referred to as a POP (Package on Package) substrate 10.

Figure 5A:
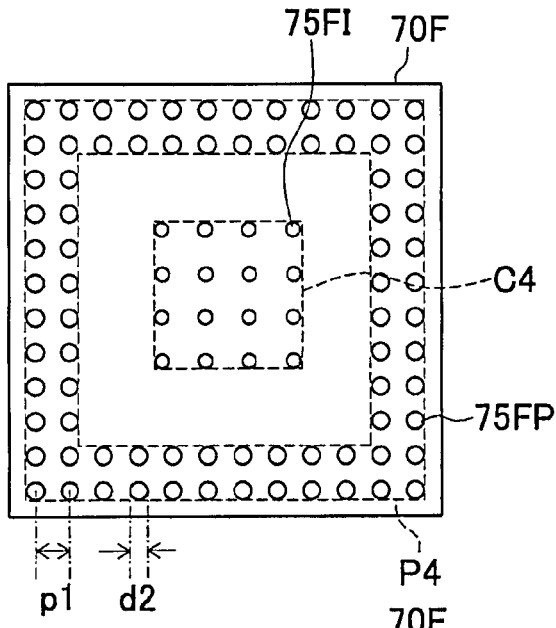
FIG. 5A illustrates a plan view of a mounting surface.

The printed wiring board 102 has a first substrate 101 (see FIG. 2) and a metal post 77. The first substrate 101 is also referred to as an intermediate substrate. The first substrate has a pad (first pad) (75FI) for mounting an electronic component 90 such as an IC chip, and a pad (second pad) (75FP) for mounting a second substrate (upper substrate) 110. An electronic component 190 such as a memory is mounted on the second substrate 110 illustrated in FIG. 1. A pad group (C4) (see FIG. 5A) is formed by the pads (75F1). The pad group (C4) is formed at a substantially center position of the first substrate 101. The pad (75FP) is formed in an outer periphery region (P4) (FIG. 5A) around the pad group (C4). The metal post 77 for mounting the upper substrate is formed on the pad (75FP). The metal post has a shape of, for example, a circular cylinder or a rectangular cylinder. A right circular cylinder is preferable. The metal post 77 has a function of electrically connecting the first substrate (lower substrate) 101 and the second substrate (upper substrate) 110. Further, even when a pitch (p1) between the pads (75FP) is 0.3 mm or less, a distance between the lower substrate 101 of the embodiment and the upper substrate 110 is ensured by the metal post 77. Further, even when the pitch (p1) between the pads (75FP) is 0.25 mm or less, a distance between the lower substrate 101 of the embodiment and the upper substrate 110 is kept constant by the metal post 77. Insulation between adjacent pads is ensured. The pitch (p1) is a distance between centers of the adjacent pads (75FP). Or, the pitch (p1) is a distance between centroids of the adjacent pads (75FP) (see FIGS. 4A and 5A).

The lower substrate of the printed wiring board of the embodiment may be a printed wiring board having a core substrate, or may be a coreless substrate. A printed wiring board having a core substrate and a manufacturing method thereof are described, for example, in JP2007227512A. The entire contents of this publication are incorporated herein by reference. A coreless substrate and a manufacturing method thereof are described, for example, in JP2005236244A. The coreless substrate has interlayer resin insulating layers and conductor layers that are alternately laminated. All of the interlayer resin insulating layers have a thickness of, for example, 60 μm or less. The second substrate also is a printed wiring board having a core substrate or is a coreless substrate.

Figure 2:
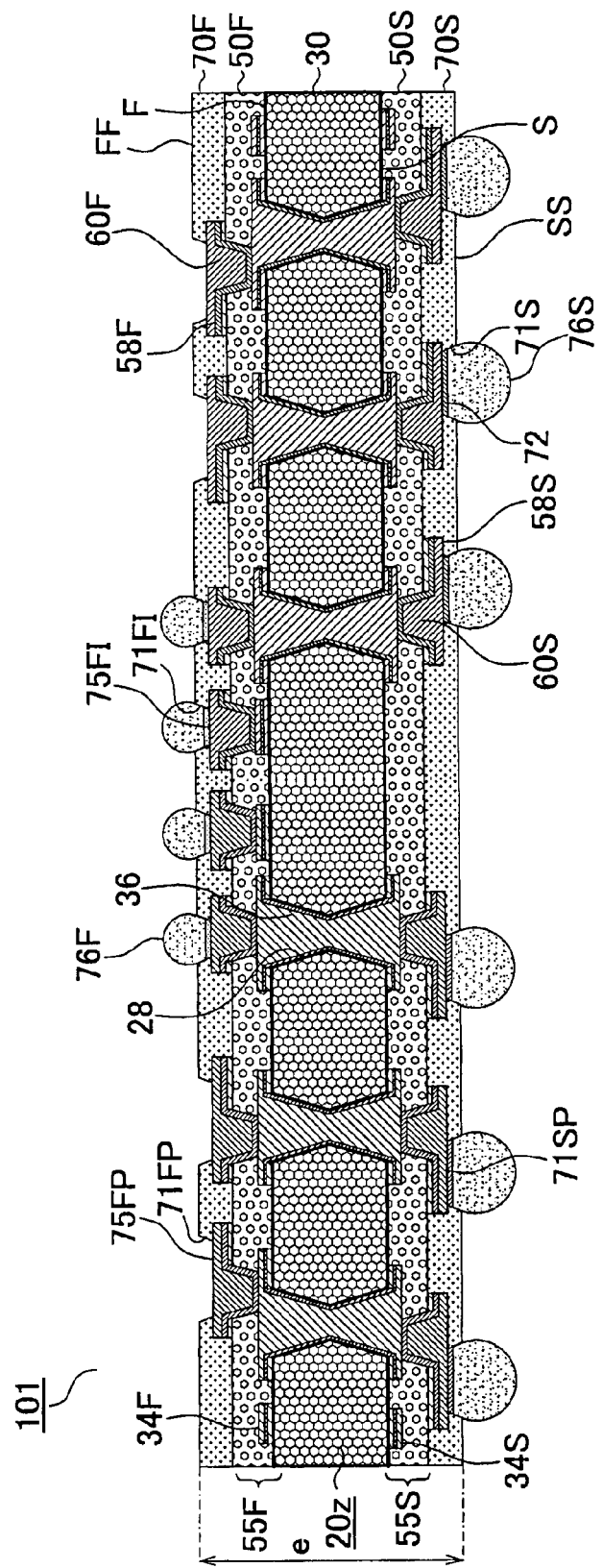
FIG. 2 illustrates a manufacturing process diagram of the printed wiring board of the first embodiment.

The first substrate 101 of the first embodiment illustrated in FIG. 2 has a core substrate 30. The core substrate has an insulating substrate (20z) that has a first surface (F) and a second surface (S) that is on an opposite side of the first surface; a first conductor layer (34F) that is formed on the first surface (F) of the insulating substrate; and a second conductor layer (34S) that is formed on the second surface of the insulating substrate. The core substrate further has a through-hole conductor 36 that fills a through hole 28 for the through-hole conductor with a plating film, the through hole 28 being formed in the insulating substrate (20z). The through-hole conductor 36 connects the first conductor layer (34F) and the second conductor layer (34S). A first surface of the core substrate and the first surface of the insulating substrate are the same surface; and a second surface of the core substrate and the second surface of the insulating substrate are the same surface.

On the first surface (F) of the core substrate 30, an interlayer resin insulating layer (uppermost interlayer resin insulating layer) (50F) is formed. On the interlayer resin insulating layer (50F), a conductor layer (uppermost conductor layer) (58F) is formed. The conductor layer (58F), the first conductor layer (34F) and the through-hole conductor are connected by a via conductor (uppermost via conductor) (60F) that penetrates through the interlayer resin insulating layer (50F). An upper side build-up layer (55F) is formed by the interlayer resin insulating layer (50F), the conductor layer (58F) and the via conductor (60F). In the first embodiment, the upper side build-up layer is a single layer. The uppermost conductor layer has the pads (75FI, 75FP).

On the second surface (S) of the core substrate 30, an interlayer resin insulating layer (lowermost interlayer resin insulating layer) (50S) is formed. On the interlayer resin insulating layer (50S), a conductor layer (lowermost conductor layer) (58S) is formed. The conductor layer (58S), the second conductor layer (34S) and the through-hole conductor are connected by a via conductor (lowermost via conductor) (60S) that penetrates the interlayer resin insulating layer (50S). A lower side build-up layer (55S) is formed by the interlayer resin insulating layer (50S), the conductor layer (58S) and the via conductor (60S). In the first embodiment, the lower side build-up layer is a single layer. The lowermost conductor layer has a BGA pad (71 SP) for connecting to a motherboard.

An upper side solder resist layer (70F) is formed on the upper side build-up layer, and a lower side solder resist layer (70S) is formed on the lower side build-up layer. The solder resist layer (70F) has an opening (first opening) (71FI) for exposing the pad (75FI) and an opening (second opening) (71FP) for exposing the pad (75FP). The solder resist layer (70S) has an opening (71S) for exposing the BGA pad (71SP). Connection members (76F, 76S) such as a solder bump and a Sn film for connecting an electronic component and a motherboard are formed on the pad (75FI) and the BGA pad (71SP). It is also possible that there is not a connection member.

As illustrated in FIG. 1, a mold resin 80 is formed for molding the metal post 77 and the IC chip 90 on the upper side solder resist layer (70F). The mold resin 80 has an opening 81. The opening 81 of the mold resin exposes an upper surface of the metal post and a portion of a side wall extending from the upper surface. The metal post 77 and a pad (175SP) of the second substrate (upper substrate) 110 are connected via a joining member (176S) such as a solder. The solder (176S) is filled in the opening 81 and is in contact with the upper surface and the side wall of the metal post 77 exposed from the opening.

A thickness (e) of the first substrate 101 is a distance from an upper surface (FF) of the upper side solder resist layer (70F) to an upper surface (SS) of the lower side solder resist layer (70S). The upper surface (FF) of the upper side solder resist layer (70F), the upper surface (SS) of the lower side solder resist layer (70S) and the thickness (distance) (e) of the first substrate are illustrated in FIG. 2. FIG. 4B illustrates a first example of the metal post. A length (b) of the metal post is a distance from an upper surface (UF) of the metal post to a lower surface (BF). The metal post of the embodiment is not bent. The metal post of the embodiment is straight. A lead line illustrated in FIG. 8 of Patent Document 1 is bent.

A ratio (b/e) ((length (b) of the metal post)/(distance (e))) between the length (b) of the metal post (distance from the upper surface (UF) to the lower surface (BF) of the metal post) and the thickness (distance) (e) of the first substrate is more than 0.3 and less than 1.0.

The second substrate is mounted on the first substrate via the metal post by reflow and the like. Due to reflow, the first substrate is exposed to high temperature. Due to the high temperature, rigidity of the first substrate is decreased. Further, the metal post is formed in an outer periphery region of the first substrate. Therefore, due to a weight of the metal post, at the high temperature, warpage is likely to occur in the first substrate. When the metal post is long, the weight of the metal post is increased. When the ratio (b/e) is 1 or more, due to the weight of the metal post, yield of mounting the second substrate on the first substrate is decreased. Further, the connection strength between the metal post and the second substrate becomes insufficient. Therefore, due to a thermal stress, the connection reliability between the first substrate and the second substrate via the metal post is decreased.

The metal post has a shape of a cylinder. Therefore, the thermal stress due to a difference between a physical property of the first substrate and a physical property of the second substrate is relaxed by the metal post. The physical property is a thermal expansion coefficient or a Young's modulus. When the metal post is long, a deformation amount of the metal post due to the thermal stress is increased. When the metal post is repeatedly subjected to a thermal stress, the metal post deteriorates due to fatigue. When the ratio (b/e) is 1 or more, deterioration of the metal post becomes significant.

When the ratio (b/e) is 0.3 or less, the metal post becomes short. The rigidity of the metal post is increased. Therefore, the stress relaxation effect due to the metal post is decreased. Therefore, the connection reliability between the first substrate and the second substrate via the metal post is decreased. The reliability of the POP substrate is decreased. When the ratio (b/e) is 0.3 or less, the distance between the lower substrate and the upper substrate is decreased. An electronic component such as a sophisticated IC chip has a thick thickness. Therefore, it is difficult to mount a sophisticated electronic component on the lower substrate. When the ratio (b/e) is more than 0.3 less than 1.0, the reliability of the POP substrate is increased. The warpage of the first substrate is decreased. Further, a printed wiring board having a post for providing a POP substrate of high reliability can be provided.

The length (b) of the metal post 77 is 50 µm-250 µm. The thickness (e) of the first substrate is 165 µm-2500 µm.

A distance (b1) from the upper surface (UF) of the metal post to a bottom part of the opening 81 (length of the side wall of the metal post that is exposed from the opening 81 of the mold resin) (see FIG. 1) is 5-20 µm. A distance (b2) from the bottom part of the opening 81 to the lower surface (BF) of the metal post (length of the side wall of the metal post that is in contact with the mold) is 45-230 µm. It is preferable that a distance (c3) (see FIG. 1) between an upper surface (80T) of the mold resin 80 and the upper substrate 110 be 50 µm or more. Heat radiation is improved.

Figure 5B:
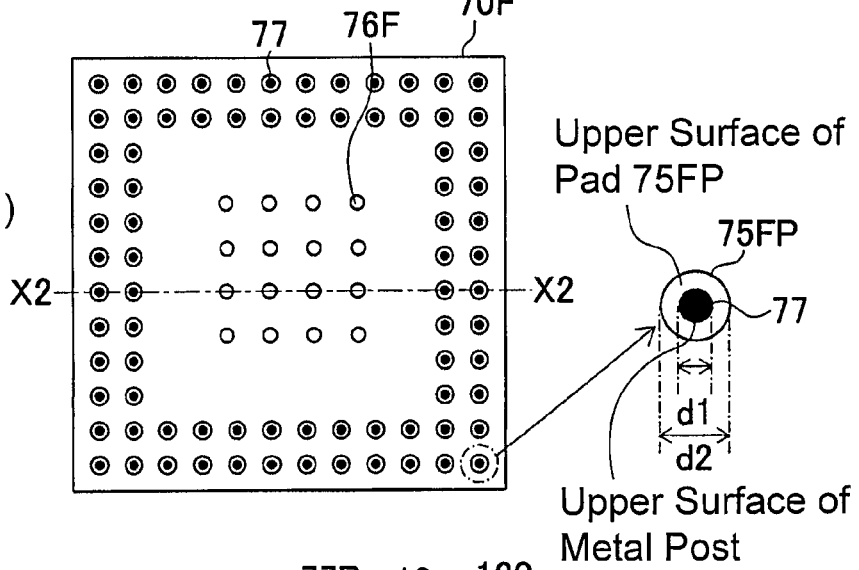
FIG. 5B illustrates a mounting surface having metal posts.

FIG. 4A illustrates a cross-sectional view of the printed wiring board 102 of the embodiment that has the metal post 77. FIG. 5B illustrates a plan view that is obtained by observing the printed wiring board illustrated in FIG. 4A from a side of the upper side solder resist. The upper surface of the metal post 77, the upper surface of the solder resist layer (70F) and the solder bump (76F) are illustrated in FIG. 5B.

FIG. 14C illustrates a second example of the metal post 77. The metal post 77 has the upper surface (UF), the lower surface (BF) on the opposite side of the upper surface, and a side surface (SW) between the upper surface (UF) and the lower surface (BF). The lower surface (BF) of the metal post opposes the pad (75FP). The side surface (SW) of the metal post 77 has a rough surface 272. An arithmetic average roughness of the rough surface is in a range from 0.1 µm to 3 µm. The upper surface (UF) and the lower surface (BF) may also each have a rough surface. Heat generated from a semiconductor element such as an IC chip on the first substrate reaches the metal post via the conductor layer of the first substrate. By having a rough surface, a surface area of the metal post is increased. Therefore, heat is efficiently radiated via the metal post to outside. The memory is vulnerable to heat. However, when the metal post has the rough surface, even when the memory is mounted on the second substrate, the memory on the second substrate is unlikely to malfunction under the influence of the heat from the semiconductor element on the first substrate. When the ratio (b/e) is 0.3 or less, the heat radiation effect due to the rough surface 272 is reduced. When the ratio (b/e) is 1 or more, the deformation amount of the metal post due to heat becomes too large. When the ratio (b/e) is more than 0.3 and less than 1, the reliability of the POP substrate is not reduced by heat caused by an active element such as an IC chip on the lower substrate.

FIG. 14D illustrates a third example of the metal post 77. In the third example, a metal film 274 is formed on the upper surface (UF), the lower surface (BF) and the side surface (SW) of the metal post. It is possible that the metal film is formed only on the side surface (SW). Examples of the metal film include Sn, Ni/Au and Ni/Pd/Au films. The Sn film is preferable. By forming the metal film, corrosion resistance of the metal post is improved. Wettability of a solder is improved. The connection reliability is improved between the second pad (75FP) and the metal post 77 via a joining member (16P) such as a solder. The connection reliability is improved between the metal post and the upper substrate via the joining member (176S). The metal film is formed by plating.

A cross section of the printed wiring board 102 along line X2-X2 in FIG. 5B is illustrated in FIG. 4A. The metal post 77 is connected on the pad (75FP) via the joining member (16P) such as a solder or a Sn film. The metal post illustrated in FIG. 4A has a shape of a circular cylinder. A diameter (d2) of the pad (75FP) is 55 µm-210 µm. The diameter of the pad is a diameter of a portion of a conductor (a conductor circuit or a via conductor) that is exposed from the solder resist layer. A diameter (d1) of the metal post 77 (a diameter of the lower surface of the metal post) is smaller than the diameter (d2). The diameter (d1) is 50 µm-200 µm. It is preferable that a ratio (d1/d2) between the diameter (d1) of the metal post and the diameter (d2) of the pad is in a range from 0.5 to 0.9. The pitch between the pads can be reduced. Even when the pitch (p1) is 0.3 mm or less, the connection reliability between the first substrate (lower substrate) and the second substrate (upper substrate) is high. Further, insulation reliability between the metal posts is high. The distance (pitch) (p1) between adjacent pads (75FP) is 100 µm-300 µm. When the pitch (p1) is less than 100 the insulation reliability between the metal posts is likely to decrease. Further, since the metal post becomes thinner, the connection reliability between the upper substrate (second substrate) and the lower substrate (first substrate) is decreased. When the pitch (p1) exceeds 300 µm, a size of the printed wiring board 10 is increased. Therefore, the stress acting on the metal post is increased and thus the connection reliability between the upper substrate and the lower substrate is decreased.

When the pitch (p1) is 0.3 mm or less, the length (b) of the metal post 77 (the distance from the upper surface (UF) to the lower surface (BF)) is 75 µm-200 µm; the diameter (d1) of the metal post is 75 µm-200 µm; and a thickness (c2) of the joining member (16P) such as a solder is 10-30 µm. The connection reliability between the lower substrate (first substrate) and the upper substrate (second substrate) of the embodiment and the insulation reliability between the metal posts are improved.

When the pitch (p1) is 0.25 mm or less, the length (b) of the metal post 77 is 100 µm-200 µm; the diameter (d1) of the metal post is 50 µm-200 µm; and the thickness (c2) of the joining member (16P) such as a solder is 10-20 µm. The connection reliability between the lower substrate and the upper substrate of the embodiment and the insulation reliability between the lower substrate and the metal post are improved.

It is preferable that an aspect ratio ((length (b))/(diameter (d1))) of the metal post be greater than 1. The stress between the upper substrate and the lower substrate is relaxed by the metal post. The connection reliability is increased. It is preferable that the aspect ratio ((length (b))/(diameter (d1))) be 1.5-3. The stress between the upper substrate and the lower substrate is relaxed. Further, the metal post does not deteriorate due to fatigue. The connection reliability between the upper substrate and the lower substrate is increased.

When the thickness (c2) of the joining member (16P) is less than a predetermined value, the metal post 77 is likely to come off from the pad (75FP). When the thickness (c2) of the joining member (16P) is more than a predetermined value, short-circuiting is likely to occur between adjacent metal posts due to the joining member.

It is also possible that the side surface of the metal post is curved, and the diameter of the post becomes the smallest between the upper surface and the lower surface. An example of this is illustrated in FIG. 4B. It is preferable that a diameter (d3) of the upper surface of the metal post is larger than a diameter (d1) of the lower surface. The connection reliability between the upper substrate and the metal post is increased. Alignment becomes easy. Since the metal post has a thin portion, the metal post can be easily deformed. Therefore, the stress is relaxed. Even when the pitch (p1) between the pads (75FP) is 0.3 mm or less, the connection reliability between the lower substrate and the upper substrate is not decreased.

As illustrated in FIG. 1, the mold resin 80 is formed for molding the electronic component 90 such as an IC chip on the upper surface of the first substrate 101. The metal post 77 is also covered by the mold resin. For example, due to a difference between a physical property of the upper substrate and a physical property of the lower substrate, a stress is applied to the metal post. Further, due to a thermal stress, the upper substrate and the lower substrate are warped. Due to the warpage, a stress acts the metal post. When the metal post has a rough surface, the mold resin is unlikely to peel off from the metal post. Due to the mold resin, the stress acting on the metal post is relaxed. Therefore, fatigue deterioration of the metal post is suppressed. Further, a stress acting between the metal post and the second substrate and a stress acting between the metal post and the first substrate are reduced. The metal post does not peel off from the first substrate and the second substrate. The connection reliability between the metal post and the upper substrate and the connection reliability between the metal post and the lower substrate are increased. The reliability of the POP substrate is increased. Due to the mold resin, deformation of the metal post is suppressed. Therefore, a crack is unlikely to occur in the joining member.

The metal post 77 has a thermal expansion coefficient larger than that of the mold resin. Therefore, the mold resin is likely to peel off from the metal post. Due to the peeling of the mold resin from the metal post, cracks are likely to occur in the upper substrate and the lower substrate. However, when the metal post has a rough surface, the mold resin is unlikely to peel off from the metal post. The reliabilities of the upper substrate, the lower substrate and the POP substrate are improved. The pitch between the second pads can be reduced. The POP substrate can be thinned.

The arithmetic average roughness of the rough surface of the metal post is 0.1 μm-3 μm. When the roughness is less than 0.1 μm, adhesion strength between the mold resin and the metal post is insufficient. The reliability of the POP substrate is decreased. When the roughness exceeds 3 μm, due to the rough surface, strength of the metal post is decreased. The reliability of the POP substrate is decreased.

It is preferable that a ratio (H/c1) between a distance (H) from the upper surface of the pad (75FP) to the upper surface of the metal post and a thickness (c1) of the pad (75FP) be 5 or more and 30 or less. When a protective film is formed on the pad, the thickness (c1) of the pad includes a thickness of the protective film. Therefore, in FIG. 4A, the thickness (c1) of the pad is a distance from an upper surface of the interlayer resin insulating layer (50F) to an upper surface of the protective film. The protective film is a film for preventing oxidation of the pad. Examples of the protective film include Ni/Au, Ni/Pd/Au, Sn, OSP, and the like. When the pitch (p1) is 0.3 mm or less, it is preferable that a value of the ratio (H/c1) is 7 or more and 25 or less. Since the pad (75FP) is a base of the metal post, when the ratio (H/c1) is too large, the metal post may come off from the pad and reliability of the metal post is reduced. When the ratio (H/c1) is too small, it is difficult to relax a stress with the metal post. The connection reliability is decreased.

The metal post is manufactured, for example, by punching a metal foil or a metal plate. By selecting a thickness of the metal foil or the metal plate, a desired metal post can be manufactured. Further, by selecting a mold, a desired metal post can be manufactured. For example, a joining member is formed on a pad and a metal post is mounted on the joining member using a mounter or the like. Then, by reflow, the metal post is bonded to the pad via the joining member. A film of a low melting point metal such as Sn or solder may be formed on a surface of the metal post by plating, sputtering, or the like. A film of a metal such as gold, tin or the like may also be formed on the surface of the metal post. The low melting point metal film may also be formed on the metal post via the metal film. When the metal post is covered by the low melting point metal film, a stress is relaxed by the low melting point metal film formed on the metal post. The reliability of the metal post is improved. The surface of the metal post includes an upper surface, a lower surface and a side surface of the metal post. It is also possible that the low melting point metal film and the metal film are formed only on the lower surface of the metal post. For example, the metal post is embedded in a resin such as a plating resist, and the lower surface of the metal post is exposed by polishing. Then, a low melting point metal film and a metal film are formed on the lower surface of the metal post. In this way, a metal post with a joining member is formed. When the metal post with the joining member is used, the metal post with the joining member may be directly bonded to the pad (75FP) by reflow or ultrasound. In this case, the joining member is formed from the low melting point metal film. Alternatively, it is also possible that the metal post with the joining member is bonded to the pad by reflow or ultrasound via a joining member such as solder or Sn that is formed on the pad.

The metal post is manufactured by processing a metal foil or a metal plate by etching. A support film 12 having a first surface (fF) and a second surface (fS) that is on an opposite side of the first surface is prepared (FIG. 6A). A bonding layer is formed on the first surface of the support film. The bonding layer is not illustrated in the drawings. A metal foil 14 such as a copper foil is bonded to the first surface of the support film (FIG. 6B). Next, an etching resist (RE) is formed on the metal foil. The metal foil that is exposed from the etching resist is removed, and the metal post 77 is formed (FIG. 6C). The side surface of the metal post is roughened using a chemical solution. An example of the chemical solution is MECetchBOND CZ-8100 supplied by Mec Co., Ltd. A rough surface 172 is formed on the side surface of the metal post (FIG. 6D). The etching resist is removed (FIG. 6E). As a result, the metal post 77 having the upper surface (UF) and the lower surface (BF) that is on an opposite side of the upper surface (UF) is formed on the support film. The upper surface of the metal post is bonded to the support film. The etching resist (RE) is formed in consideration of arrangement of the pad (75FP). Therefore, arrangement of the metal post on the support film is the same as the arrangement of the pad (75FP). The metal post on the support film is mounted on the pad (75FP) via a solder bump (160P) on the first substrate (FIG. 3B). In this case, the solder bump (160P) is formed in advance on the pad (75FP). By reflow or ultrasound, the metal post is bonded to the pad via the joining member (16P). The bonding layer of the support film has an adhesive force weaker than that of the joining member. Therefore, the support film can be peeled off from the upper surface of the metal post. The metal post 77 is formed on the pad (75FP) (FIG. 4A).

Figure 7A:
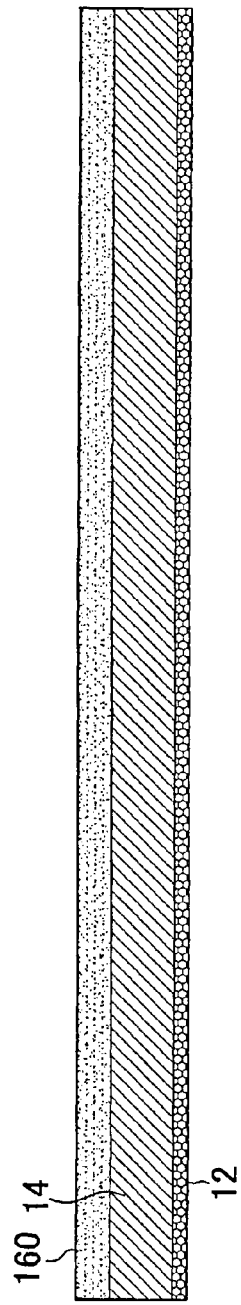
FIG. 7A-7D illustrate manufacturing process diagrams of a metal post of the printed wiring board according to the first embodiment.
Figure 7B:
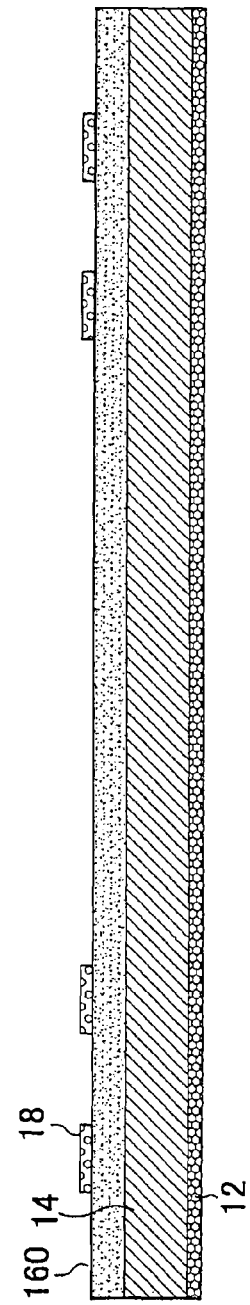
Figure 7C:
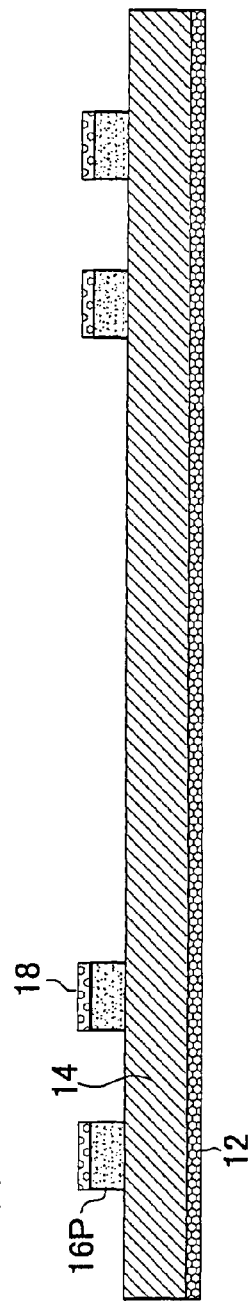

A joining layer 160 such as solder or Sn can be formed on the metal foil 14 (FIG. 6B) on the support film (FIG. 7A). Next, an etching resist 18 is formed on the joining layer 160 (FIG. 7B). Thereafter, the joining layer 160 is removed by etching (FIG. 7C). Further, using the same etching resist, the metal foil is removed by etching (FIG. 8C). It is preferable that an etching solution for etching the joining layer 160 and an etching solution for etching the metal foil be different. The joining layer is selectively removed and subsequently the metal foil is selectively removed. The side surface of the metal post is roughened using a chemical solution. A rough surface 172 is formed on the side surface of the metal post. Next, the etching resist is removed. A metal post (77P) with a joining member is manufactured (FIG. 8B). It is also possible that the joining layer that is exposed from the etching resist is removed and subsequently the etching resist is removed. The joining member (16P) is formed from the joining layer. Thereafter, the metal foil can be etched by using the joining member (16P) as an etching mask. The same metal post (77P) with a joining member is manufactured (FIG. 8B). When the metal post with the joining member is used, the metal post with the joining member may be directly bonded to the pad by reflow or ultrasound. Alternatively, it is also possible that the metal post with the joining member is bonded to the pad by reflow or ultrasound via the solder bump (160P) on the pad. Using such a method, the metal post is manufactured separately from the first substrate. The metal post is not formed on the first substrate. A metal post can also be manufactured by cutting a metal wire having a desired diameter into a predetermined length. It is preferable that the metal wire or the metal foil be formed of copper or a copper alloy. It is preferable that the metal post be formed of copper or a copper alloy. As the joining member, Sn/Ag solder or Sn/Ag/Cu solder is preferred.

The printed wiring board of the first embodiment has the metal post 77, which is manufactured separately from the first substrate, on the pad (75FP). The metal post is bonded to the pad (75FP) via the joining member (16P). In the present embodiment, the metal post is manufactured separately from the first substrate 101. For example, the metal post is formed from a metal foil or a metal wire. Variation in the lengths of the metal posts of the present embodiment is small as compared to metal posts that are directly formed on the first substrate. Therefore, yield of mounting the upper substrate on the metal post of the printed wiring board 102 is increased. It is possible to provide the printed wiring board 10 that can be easily mounted. When the variation in the heights of the metal posts is large, a stress is likely to concentrate on a particular metal post and thus the connection reliability is low. However, in the present embodiment, the variation in the lengths of the metal posts is small. Therefore, the connection reliability between the upper substrate and the lower substrate is high.

The diameter (d1) of the metal post that is formed separately from the printed wiring board is smaller than the diameter (d2) of the pad. Therefore, even when the pitch (p1) decreases, a spacing distance between adjacent metal posts can be increased. In the present embodiment, the pitch (p1) can be reduced. Since the spacing distance between adjacent metal posts is large, even when the pitch (p1) is 0.3 mm or less, the insulation reliability between the metal posts is high. When the pitch (p1) is 0.25 mm or less, the metal post becomes thin. In order to increase the connection reliability, it is preferable that an aspect ratio (b/d1) of the metal post is 1.5 or more. When the number of the pads (75FP) increases, the size of the printed wiring board is increased. However, when the aspect ratio (b/d1) of the metal post is 2 or more, a stress caused by a difference between a physical property of the upper substrate and a physical property of the lower substrate is relaxed by the metal post. When the ratio (b/d1) exceeds 3.5, the metal post deteriorates in a heat cycle. Examples of the physical property include a thermal expansion coefficient and a Young's modulus.

As illustrated in FIG. 1, the lower substrate 101 and the upper substrate 110 are connected by the metal post 77 that has high rigidity, and the joining members (16P, 176S) that sandwich the metal post 77. It is preferable that the joining members are solders. The joining members have a rigidity lower than that of the metal post. A thermal stress between the upper substrate and the lower substrate is relaxed by the joining members. Strength of an electronic device that has the upper substrate and the lower substrate is maintained by the metal post. Warpage of the electronic device due to a difference in a physical property of the upper substrate and a physical property of the lower substrate is reduced. In the present embodiment, the metal post is formed from a metal foil or a metal wire. Further, the metal post is mounted on the pad by reflow, ultrasound, or the like. Therefore, the manufacturing method is simplified.

FIG. 6A-7D illustrate a method for manufacturing the metal post using an etching method.

(1) A support film 12 is prepared (FIG. 6A). The support film is formed by a based film and a bonding layer, the based film having a first surface (fF) and a second surface (fS) that is on an opposite side of the first surface, the bonding layer being formed on the first surface of the base film. As the support film, for example, a high heat resistant adhesive tape 9079 manufactured by Sumitomo 3M Ltd. can be used.

(2) A metal layer 14 such as a metal foil (copper foil) having a thickness of 0.1 mm is laminated on the bonding layer of the support film 12 (FIG. 6B). The thickness of the metal layer (metal foil) is selected according to the length of the metal post 77. It is preferable that the metal layer be a copper foil or a copper alloy foil. In the present embodiment, the copper foil is used.

(3) A joining layer 160 having a thickness of 20 μm is formed on the copper foil 14 by electrolytic solder plating (FIG. 7A).

(4) An etching resist 18 is formed on the joining layer 160 (FIG. 7B). A position at which the etching resist 18 corresponds to position of the pad (75FP) illustrated in FIG. 5A. The arrangement of the etching resist 18 is the same as the arrangement of the pad 75. Each plating resist 18 has a shape of a circular cylinder.

Figure 5C:
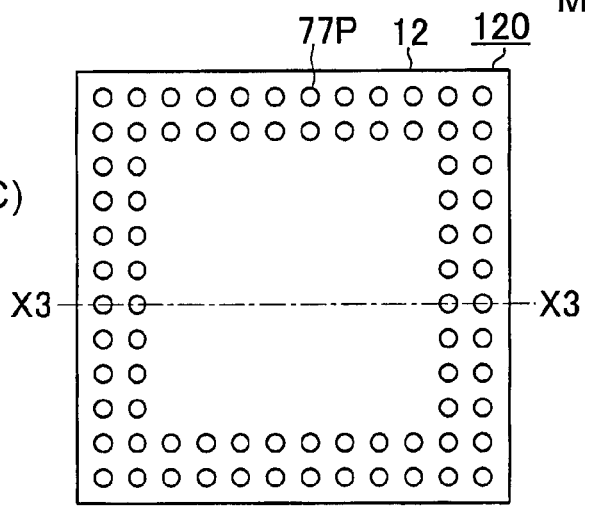
FIG. 5C illustrates a plan view illustrating a support film and metal posts.
Figure 7D:
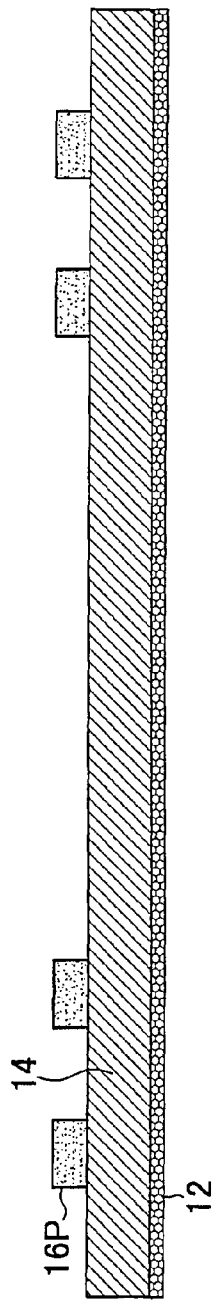

(5) The joining layer 160 that is exposed from the etching resist 18 is removed by selective etching (FIG. 7C). As an etching solution, for example, E-process-WL manufactured by Meltex Inc. is used. The etching resist 18 is removed (FIG. 7D). Using the joining member (16P) as an etching mask, the metal foil is selectively removed (FIG. 8A). As an etching solution, for example, SF-5420 manufactured by MEC Co Ltd. is used. The side surface of the metal post is roughened using a chemical solution. A rough surface 172 is formed on the side surface of the metal post (FIG. 8B). The metal post (77P) with the joining member is formed. FIG. 5C illustrates a plan view the metal post (77P) with the joining member on the support film 12 and the support film exposed from the metal post (77P) with the joining member.

A cross section along line X3-X3 of FIG. 5C is illustrated in FIG. 8B. The joining member may be formed on the metal post. By removing the metal foil exposed from a mask for etching, such as the etching resist and the etching mask, the metal post is formed. A thinnest portion can be formed on the side surface of the metal post (FIG. 4B). The side surface of the metal post is curved. A surface of the metal post that opposes the support film is the upper surface. The metal post is formed by etching from the lower surface side of the metal post. The difference between the diameter (d3) of the upper surface and the diameter (d1) of the lower surface of the metal post can be increased by reducing an etching speed. A joining member such as solder is formed on the lower surface of the metal post. The lower surface (BF) of the metal post opposes the pad (75FP).

A method for bonding the metal post 77 to the printed wiring board is illustrated in FIG. 2-5C.

FIG. 2 illustrates an intermediate substrate 101. The intermediate substrate illustrated in FIG. 2 has the pad (75FP), and the metal post is mounted on the pad (75FP). The intermediate substrate illustrated in FIG. 2 may be manufactured, for example, using a method described in Japanese Patent Laid-Open Publication No. 2012-069926. The entire contents of this publication are incorporated herein by reference. An OSP (Organic Solderability Preservative) film may be formed on the pad (75FP) that is exposed from the opening (71 FP) of the solder resist layer (70F) of the intermediate substrate 101. Here, in place of the OSP film, it is also possible that a protective film such as a nickel-gold film or a nickel-palladium-gold film is formed.

As illustrated in FIG. 3A, the pad (75FP) and the metal post are aligned. A support film 120 with the metal post illustrated in FIG. 8B is placed on the intermediate substrate 101. In this case, the lower surface of the metal post opposes the pad (75FP). The joining member (16P) is placed on the pad (75FP). The support film with the metal post and the intermediate substrate both have alignment marks. The two are aligned using the alignment marks of the two.

The support film 120 with the metal post is laminated on the intermediate substrate 101 illustrated in FIG. 2. In this state, the joining member (16P) is heated (FIG. 3A). The joining member such as solder is melted. The metal post 77 is bonded to the pad (75FP) by the joining member. An adhesive force between the metal post and the bonding layer of the support film is weaker than an adhesive force between the metal post and the joining member and an adhesive force between the pad (75FP) and the joining member. Therefore, the support film can be removed from the metal post. The printed wiring board 102 of the first embodiment is completed (FIG. 4A).

A method for manufacturing the applied example (POP substrate 10) illustrated in FIG. 1 is illustrated in FIG. 9.

An electrode 92 of the IC chip 90 is connected to the solder bump (76F) of the printed wiring board 102. The IC chip 90 is mounted on the printed wiring board 102. Thereafter, the mold resin 80 is formed on a mounting surface of the printed wiring board 102. The metal post 77 and the electronic component are molded by the mold resin (FIG. 9A). The metal post 77 is embedded in the mold resin 80. The opening 81 that expose the upper surface (UF) of the metal post 77 and the side wall connecting to the upper surface is formed in the mold resin 80 (FIG. 9B). The side surface of the metal post is partially exposed. The opening 81 is formed using laser. The second substrate (upper substrate) 110 is bonded to the metal post 77 via the joining member (176S) such as a solder. The second substrate (upper substrate) is mounted on the printed wiring board 102 (FIG. 1). The POP (Package on Package) substrate is completed. It is also possible that the POP substrate does not have the solder bump 76S on the BGA pad (71SP).

The opening 81 is filled by a joining member that connects the upper substrate and the metal post. The joining member (176S) and the metal post are bonded via the upper surface of the metal post and a portion of the side wall. A bonding strength between the two is increased. The connection reliability via the metal post is increased. As illustrated in FIGS. 9A and 9B, the upper surface (80T) of the mold resin is positioned above the upper surface (UF) of the metal post. A protective film can be formed on the upper surface of the metal post and a portion of the side wall that are exposed from the opening 81. Examples of the protective film include a nickel/gold film, a nickel/palladium/gold film, and the like.

In the method for manufacturing the printed wiring board of the first embodiment, the metal post 77 is formed by etching the metal foil (copper foil) 14 having a uniform thickness. Therefore, the respective metal posts have substantially the same length. Also in the case where the metal post is formed by cutting a metal wire, the metal posts have uniform diameters and lengths. The printed wiring board having the metal post that is formed from the metal foil and the printed wiring board having the metal post that is formed from the metal wire have the same effect. The manufacturing method of the first embodiment can manufacture a highly reliable metal post. The metal posts can be arranged with a fine pitch.

Second Embodiment

Figure 10:
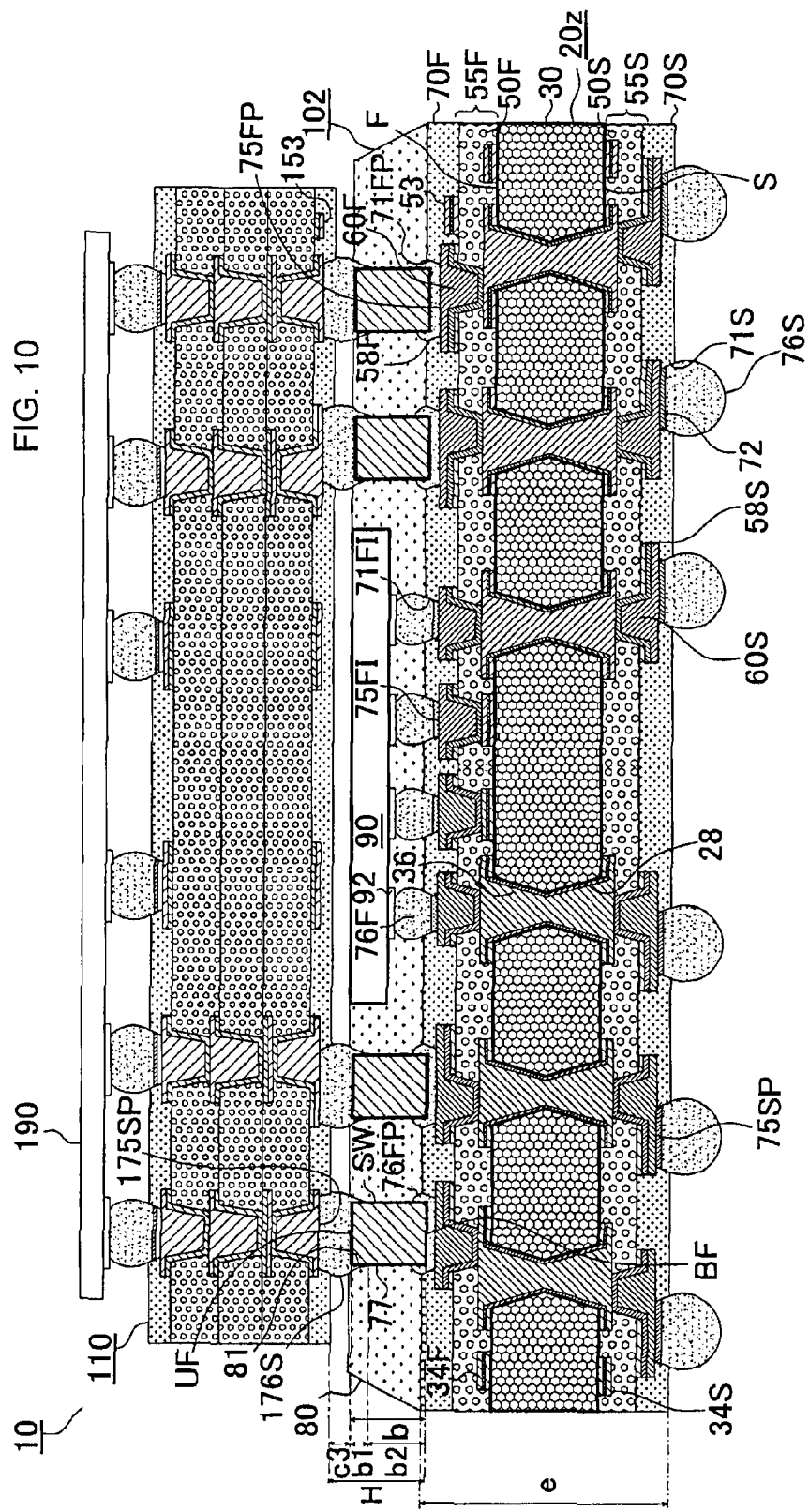
FIG. 10 illustrates a cross-sectional view of an applied example of a printed wiring board according to a second embodiment.

An applied example of a printed wiring board 10 according to a second embodiment of the present invention is illustrated in FIG. 10. A first substrate of the second embodiment is the same as the first substrate of the second embodiment; and a second substrate of the second embodiment is the same as the second substrate of the second embodiment. A POP substrate of the second embodiment has the same mold resin as the first embodiment.

In the second embodiment, a metal post formed from a metal wire is mounted on the first substrate. A metal post having a rough surface on a side surface thereof is manufactured by embossing a side surface of a metal wire. Alternatively, by processing the side surface of the metal wire using a chemical solution same as the chemical solution used in the first embodiment, a rough surface is formed on the side surface of the metal wire. Examples of other methods are illustrated below. A metal post is formed from a metal foil by punching processing or etching processing. Next, a rough surface is formed on a side surface of the metal post by embossing or using a chemical solution.

In the case where the metal wire is used, the metal post having a rough surface on the side surface thereof is manufactured by cutting the metal wire having a predetermined diameter into a certain length. A film of a low melting point metal such as solder may be formed on a surface of the metal post that has a rough surface on the side surface thereof by plating, sputtering or the like. A metal film such as a film of Sn, Ni/Au, Ni/Pd/Au or the like may be formed on the surface of the metal post that has a rough surface on the side surface thereof. Due to the metal film, oxidation of the metal post is prevented. The low melting point metal film may also be formed on the rough surface of the metal post via the metal film. When the rough surface of the metal post is covered by the low melting point metal film, a stress is relaxed by the low melting point metal film formed on the metal post. The reliability of the metal post is improved. It is preferable that Au and Sn films be sequentially formed on the rough surface of the metal post.

The metal post that has a rough surface on the side surface thereof is mounted on the first substrate by reflow or ultrasound similar to the first embodiment. The metal post with a joining member may be directly bonded to the pad (75FP) by reflow or ultrasound. Alternatively, it is also possible that the metal post is bonded to the pad by reflow or ultrasound via a joining member such as solder or Sn that is formed on the pad. It is preferable that the joining member be Sn/Ag solder or Sn/Ag/Cu solder.

The arithmetic average roughness of the rough surface of the metal post of the second embodiment and the arithmetic average roughness of the rough surface of the metal post of the first embodiment are the same. When the rough surface of the metal post is formed using a chemical solution, by adjusting processing condition, the arithmetic average roughness of the rough surface of the metal post can be adjusted. When the rough surface of the metal post is formed by embossing, a rough surface having a roughness (arithmetic average roughness) exceeding 3 µm by embossing may be formed on the side surface of the metal wire or the metal post. Thereafter, by forming a metal film or a low melting point metal film on the rough surface, the roughness of the rough surface is adjusted to be in a range of 0.1 µm-3 µm.

FIG. 14 illustrates a method for manufacturing a metal post.

(1) A metal wire 270 having a diameter substantially the same as the metal post is prepared (FIG. 14A). The metal wire is made of copper, a copper alloy, or aluminum.

(2) By embossing a surface of the metal wire 270, a primary rough surface 272 is formed (FIG. 14B). The primary rough surface 272 has a roughness (arithmetic average roughness) exceeding 3 µm and less than 5 µm.

(3) The metal wire is cut according to a length (50 µm-200 µm) of the metal post (FIG. 14C). When the metal wire is cut, rough surfaces are formed on the upper surface (UF) and the lower surface (BF) of the metal post.

(4) A metal film 274 is formed on the entire surface of the metal post. The metal film is formed by plating. The roughness (arithmetic average roughness) of the side surface (SW) of the metal post is adjusted to be in a range of 0.1 µm-3 µm. The roughness (arithmetic average roughness) of the upper surface (UF) and the lower surface (BF) of the metal post is adjusted to be in a range of 0.1 µm-3 µm. When the upper surface and the lower surface of the metal post have a rough surface, the bonding strength between the metal post and a joining member is increased. It is preferable that the metal film be a Sn, Ni/Au or Ni/Pd/Au film. Due to the metal film, corrosion resistance and solder wettability of the metal post are improved. The roughness of the rough surface of the metal post can be adjusted by embossing alone.

Figure 11:
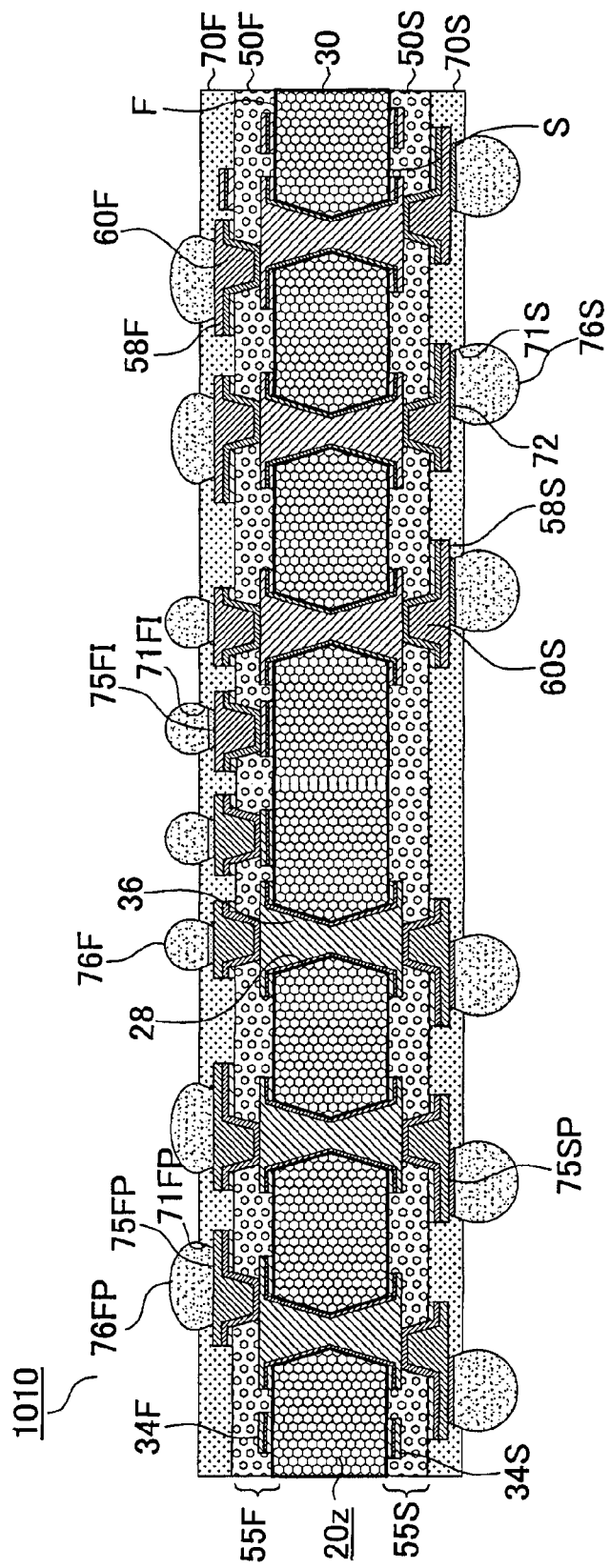
FIG. 11 illustrates a manufacturing process diagram of the printed wiring board of the second embodiment.
Figure 12:
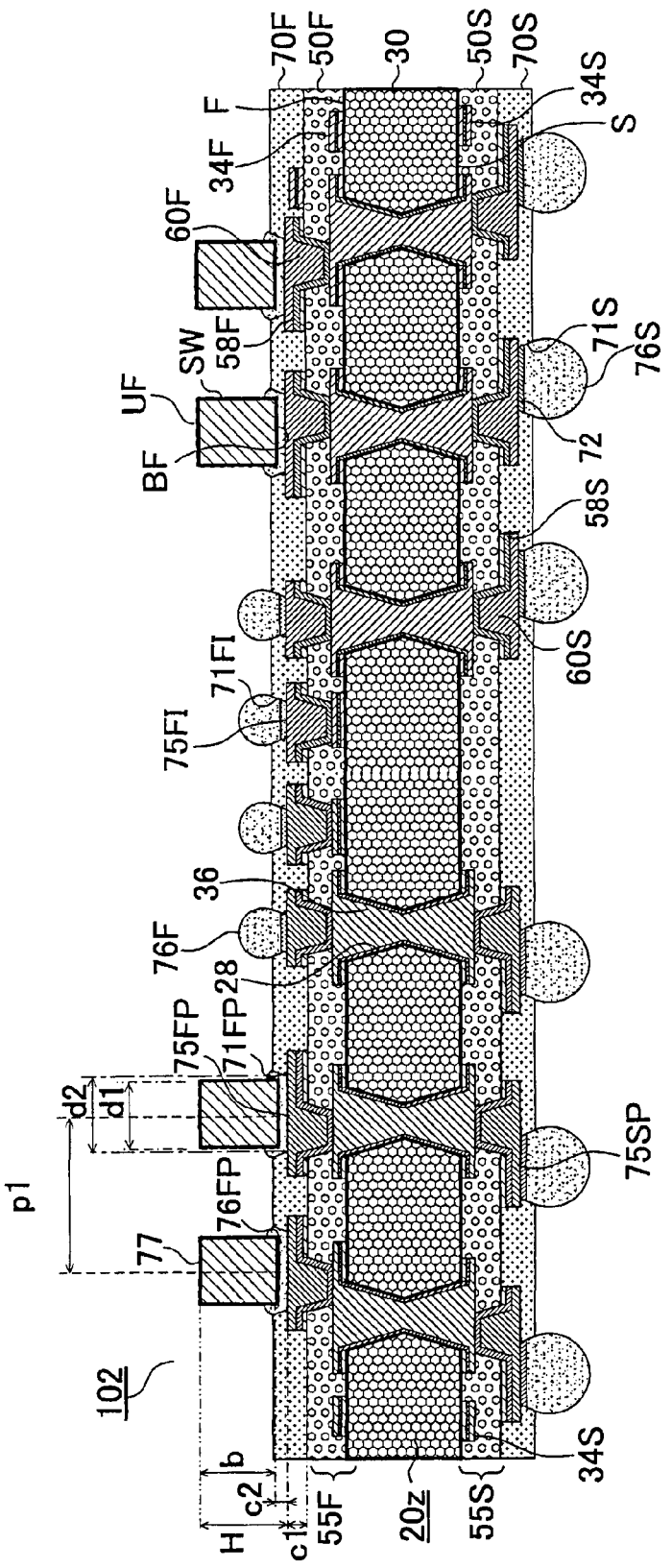
FIG. 12 illustrates a cross-sectional view of the printed wiring board of the second embodiment.

FIGS. 11, 12 and 13A-13C illustrate a method for bonding the metal post 77 to the first substrate. FIG. 11 illustrates a cross section of an intermediate substrate 1010 of a second example. The second intermediate substrate illustrated in FIG. 11 has a pad (75FP). A joining member (76FP) such as a solder bump is formed on the pad (75FP).

A jig 300 for mounting the metal post is prepared (FIG. 13A). The jig has a through hole 302. The through holes 302 and the pads (75FP) are in one-to-one correspondence. By using an alignment mark 304 of the jig and an alignment mark 53 of the first substrate, the jig 300 and the second intermediate substrate 1010 are aligned (FIG. 13B). The through holes 302 are respectively positioned on the pads (75FP). Next, by using a mounter or the like, the metal posts 77 are respectively inserted into the through holes 302 (FIG. 13C). The metal posts 77 are respectively placed on the solder bumps (76FP).

The jig and the metal posts 77 are placed on the second intermediate substrate 1010. In this state, reflow is performed. By the reflow, the metal posts are bonded to the joining members (76FP). The metal posts are bonded to the first substrate. Next, the jig is removed from the intermediate substrate. The printed wiring board 102 is completed.

When physical properties of a first semiconductor package and a second semiconductor package do not match, for example, due to a thermal stress acting on lead lines, it is conceivable that connection reliability between the first semiconductor package and the second semiconductor package is decreased.

A POP substrate according to an embodiment of the present invention has a high connection reliability. A printed wiring board according to an embodiment of the present invention has a post for providing the POP substrate having a high reliability.

A printed wiring board according to an embodiment of the present invention includes a first substrate that has a first pad for mounting an electronic component and a second pad for electrically connecting to a second substrate, and a metal post that is formed on the second pad and is for mounting the second substrate. A value obtained by dividing a length of the metal post by a thickness of the first substrate is 0.3-1.0.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
    a first substrate comprising a plurality of first pads and a plurality of second pads such that the plurality of first pads is positioned to mount an electronic component on the first substrate and that the plurality of second pads is positioned to electrically connect a second substrate to the first substrate; and
    a plurality of metal posts formed on the plurality of second pads, respectively, such that the plurality of metal posts is positioned to mount the second substrate on the first substrate and that each of the metal posts has an upper surface, a lower surface and a curved side surface forming a smallest diameter between the upper surface and the lower surface,
    wherein the first substrate and the plurality of metal posts satisfy that a ratio, b/e, is in a range from 0.3 to 1.0, where b represents a length of each of the metal posts and e represents a thickness of the first substrate.

2. A printed wiring board according to claim 1, wherein each of the metal posts has the curved side surface which is a roughened surface.

3. A printed wiring board according to claim 2, wherein each of the metal posts has a metal film formed on the roughened surface.

4. A printed wiring board according to claim 2, wherein each of the metal posts comprises a metal wire, and the roughened surface of each of the metal posts is an embossed surface of the metal wire.

5. A printed wiring board according to claim 1, wherein each of the metal posts comprises a metal wire.

6. A printed wiring board according to claim 1, wherein the length of each of the metal posts is in a range of from 50

μm to 250 μm, and the thickness of the first substrate is in a range of from 165 μm to 1500 μm.

7. A printed wiring board according to claim 1, wherein each of the metal posts is formed such that the upper surface has a diameter d3 which is larger than a diameter d1 of the lower surface.

8. A printed wiring board according to claim 1, wherein each of the metal posts has the curved side surface which is a roughened surface.

9. A printed wiring board according to claim 8, wherein the first substrate has a first surface and a second surface on an opposite side with respect to the first surface, and the first substrate has the plurality of first pads and the plurality of second pads on the first surface and a plurality of third pads on the second surface such that the plurality of third pads is positioned to connect to a motherboard to the second surface of the first substrate.

10. A printed wiring board according to claim 1, further comprising:
    the electronic component mounted on the plurality of first pads.

11. A printed wiring board according to claim 1, further comprising:
    the electronic component mounted on the plurality of first pads; and
    a mold resin structure in which the electronic component and the plurality of metal posts are molded.

12. A printed wiring board according to claim 1, wherein the first substrate has a first surface and a second surface on an opposite side with respect to the first surface, and the first substrate has the plurality of first pads and the plurality of second pads on the first surface and a plurality of third pads on the second surface such that the plurality of third pads is positioned to connect to a motherboard to the second surface of the first substrate.

13. A printed wiring board according to claim 2, wherein each of the metal posts has a metal film formed on the roughened surface, and the metal film is one of a Sn film, a Ni/Au film and a Ni/Pd/Au film.

14. A printed wiring board according to claim 1, further comprising:
    a plurality of joining members joining the plurality of metal posts to the plurality of second pads, respectively, wherein each of the metal posts comprises a metal wire.

15. A printed wiring board according to claim 1, wherein each of the metal posts has an aspect ratio, b/d1, which is greater than 1, where b represents the length of each of the metal posts and d1 represents a diameter of the lower surface of each of the metal posts.

16. A printed wiring board according to claim 1, wherein the plurality of second pads is formed at a pitch in a range of from 110 μm to 300 μm.

17. A method for manufacturing a printed wiring board, comprising:
    forming a plurality of first pads on a first substrate such that the plurality of first pads is positioned to mount an electronic component on the first substrate;
    forming a plurality of second pads such that the plurality of second pads is positioned to electrically connect a second substrate to the first substrate; and
    forming a plurality of metal posts on the plurality of second pads, respectively, such that the plurality of metal posts is positioned to mount the second substrate on the first substrate and that each of the metal posts has an upper surface, a lower surface and a curved side surface forming a smallest diameter between the upper surface and the lower surface,
    wherein the first substrate and the plurality of metal posts satisfy that a ratio, b/e, is in a range from 0.3 to 1.0, where b represents a length of each of the metal posts and e represents a thickness of the first substrate.

18. A method for manufacturing a printed wiring board according to claim 17, wherein the forming of the metal posts comprises forming the curved side surface which is a roughened surface on each of the metal posts.

19. A method for manufacturing a printed wiring board according to claim 18, further comprising:
    forming a metal film on the roughened surface of each of the metal posts.

20. A method for manufacturing a printed wiring board according to claim 17, wherein the forming of the metal posts comprises cutting a metal wire to a plurality of metal wires each having the length and embossing a side surface of each of the metal wires such that a roughened surface is formed on the curved side surface of each of the metal wires.

* * * * *